United States Patent
Stahl et al.

(10) Patent No.: US 7,436,076 B2
(45) Date of Patent: Oct. 14, 2008

(54) MICROMECHANICAL COMPONENT HAVING AN ANODICALLY BONDED CAP AND A MANUFACTURING METHOD

(75) Inventors: Heiko Stahl, Reutlingen (DE); Nicolaus Ulbrich, Gomaringen (DE); Rainer Straub, Ammerbuch (DE)

(73) Assignee: Robert Bosch GmbH, Stuttgart (DE)

( * ) Notice: Subject to any disclaimer, the term of this patent is extended or adjusted under 35 U.S.C. 154(b) by 33 days.

(21) Appl. No.: 11/512,647

(22) Filed: Aug. 29, 2006

(65) Prior Publication Data
US 2007/0087465 A1 Apr. 19, 2007

(30) Foreign Application Priority Data
Aug. 29, 2005 (DE) .................. 10 2005 040 789

(51) Int. Cl.
- H01L 23/29 (2006.01)
- H01L 23/58 (2006.01)
- H01L 23/28 (2006.01)

(52) U.S. Cl. .................. 257/794; 257/644; 257/787; 257/788; 257/798

(58) Field of Classification Search .................. 257/644, 257/787–788, 794, 798
See application file for complete search history.

(56) References Cited

U.S. PATENT DOCUMENTS

| | | | | |
|---|---|---|---|---|
| 4,625,561 A | * | 12/1986 | Mikkor | .................. 73/724 |
| 5,273,939 A | * | 12/1993 | Becker et al. | .................. 438/48 |
| 6,436,853 B2 | * | 8/2002 | Lin et al. | .................. 438/800 |
| 6,926,592 B2 | * | 8/2005 | Brandes | .................. 451/54 |
| 7,045,868 B2 | * | 5/2006 | Ding et al. | .................. 257/414 |
| 7,291,512 B2 | * | 11/2007 | Unger | .................. 438/53 |
| 2004/0077117 A1 | * | 4/2004 | Ding et al. | .................. 438/51 |
| 2004/0234424 A1 | * | 11/2004 | Pai et al. | .................. 422/131 |
| 2005/0139940 A1 | * | 6/2005 | Patel et al. | .................. 257/414 |
| 2005/0239228 A1 | * | 10/2005 | Quenzer et al. | .................. 438/29 |
| 2006/0219653 A1 | * | 10/2006 | Quenzer et al. | .................. 216/2 |

FOREIGN PATENT DOCUMENTS

| DE | 197 00 734 | 7/1998 |
|---|---|---|
| DE | 101 04 868 | 8/2002 |

\* cited by examiner

*Primary Examiner*—Ida M Soward
(74) *Attorney, Agent, or Firm*—Kenyon & Kenyon LLP

(57) ABSTRACT

A micromechanical component includes a cap wafer made up of at least a first silicon substrate and a thin glass substrate, and having a functional wafer made up of at least a second silicon substrate, at least one electrical contact surface being disposed on the functional wafer. the cap wafer is joined at the glass substrate to the functional wafer by anodic bonding. the electrical contact surface is disposed on a side of the functional wafer facing the cap wafer, and the cap wafer has at least one recess, such that an access is provided to the electrical contact surface. A method for encapsulating a micromechanical component having a cap wafer, by anodically bonding the cap wafer to a functional wafer.

2 Claims, 3 Drawing Sheets

MICROMECHANICAL COMPONENT HAVING AN ANODICALLY BONDED CAP AND A MANUFACTURING METHOD

FIELD OF THE INVENTION

The present invention relates to a micromechanical component having a cap wafer made up of at least a first silicon substrate and a thin glass substrate, and having a functional wafer made up of at least a second silicon substrate, at least one electrical contact surface being disposed on the functional wafer. The cap wafer is joined at the glass substrate to the functional wafer by anodic bonding. The present invention further relates to a method for encapsulating (packaging) a micromechanical component having a cap wafer, by anodically bonding the cap wafer to a functional wafer. The present invention further relates to a method for structuring the composite cap that is compatible with the electrical contacting in the sealing-glass encapsulation technology customary under the state of the art, and using which, it is possible to dispense with the technologically costly backside contacting.

BACKGROUND INFORMATION

Inertial sensors are usually encapsulated using silicon cap wafers by sealing-glass bonding. Such a manufacturing method is described in German Patent Application No. DE 19700734. The electrical contacting is accomplished by cutouts, produced specifically for this purpose, in the cap wafer. When using sealing-glass bonding, a long-lasting hermetic and reliable bond is only made possible with relatively wide bonding frames.

The use of anodically bondable cap wafers permits a significant reduction in the width of the bonding frames, and with that, the surface-area requirement per sensor chip. Therefore, anodically bondable cap wafers are used in newer encapsulation techniques like, for example, the MPT (micro packaging technology) put forward in German Patent Application No. DE 10104868. Here, anodically bondable composite wafers made up of a silicon carrier substrate and a sufficiently thin glass substrate are used as cap wafers. The glass substrate must be selected to be thin enough that the ability of the cap wafer to be sawed by the series equipment usually used is ensured.

Because the composite cap is difficult to structure, when working with MPT, for example, the electrical accesses are produced from the back side of the sensor substrate with some degree of technological complexity. This includes, first of all, the internal wiring of the sensor structures, which differs sharply from the previous series processes. Moreover, the complicated backside contacting requires planarization of the composite cap, edge grinding and back grinding of the sensor substrate, stress relief of the sensor substrate, Si-DRIE (deep reactive ion etching) of isolation trenches, and finally a costly refill technique, including the producing of bonding pads on the back side of the sensor substrate.

SUMMARY OF THE INVENTION

The present invention is based on a micromechanical component having a cap wafer made up of at least a first silicon substrate and a thin glass substrate, and having a functional wafer made up of at least a second silicon substrate, at least one electrical contact surface being disposed on the functional wafer. The cap wafer is joined at the glass substrate to the functional wafer by anodic bonding. An essence of the present invention is that the electrical contact surface is disposed on a side of the functional wafer facing the cap wafer, and the cap wafer has at least one recess, such that an access is provided to the electrical contact surface.

Advantageously, in this context, a micro-electro-mechanical functional structure to be encapsulated and contact surfaces electrically connected to it are disposed on the same side of the functional wafer, thereby simplifying the electrical wiring, and thus the structure of the micromechanical component. The small space required for joining the functional wafer and cap wafer by the anodic bond is likewise advantageous.

One advantageous embodiment of the micromechanical component provides that the recess is an access opening in the cap wafer in the form of a contact via. Advantageously, this allows the contact surfaces to be placed at nearly any location on the side of the functional wafer facing the cap wafer.

The present invention further relates to a method for encapsulating a. micromechanical component having a cap wafer, by anodically bonding the cap wafer to a functional wafer. The present invention includes the following manufacturing steps:

(A) Providing a cap wafer made up of at least a first silicon substrate and a thin glass substrate, as well as a functional wafer made up of at least a second silicon substrate having at least one electrical contact surface.
(B) Producing at least a first recess in the cap wafer.
(C) Anodically bonding the cap wafer on the side of the thin glass substrate to the functional wafer, the first recess in the cap wafer being disposed opposite the electrical contact surface of the functional wafer.
(D) Producing at least a second recess in the cap wafer, which is advanced up to the first recess in such a way that an access is opened to the electrical contact surface.

In this context, it is advantageous that the method of the present invention for structuring the cap wafer in the form of a composite cap is compatible with the electrical contacting in the sealing-glass encapsulation technology customary under the state of the art, and it is possible to dispense with the technologically costly backside contacting.

In one advantageous refinement of the method according to the present invention, after the functional wafer has been anodically bonded to the cap wafer, the cap wafer is thinned down on the backside. Costs for subsequent process steps to create an access to the electrical contact surface may advantageously be saved here.

A further advantageous development of the method according to the present invention provides that the second recess in the cap wafer is advanced in a manner that first, the first silicon substrate is structured using an SI-RIE (reactive ion etching) etching process, after that the thin glass substrate is pre-structured using a wet-chemical etching method, and finally, using a dry-chemical etching method such as oxide-RIE, the second recess is advanced through the thin glass substrate up to the first recess. Advantageously, in so doing, the structured first silicon substrate serves as a mask for the two following steps for structuring the glass substrate. The following pre-structuring of the glass substrate is advantageous because it is cost-effective. Finally, the structuring of the glass substrate using a dry-chemical etching method up to the opening of an access to the contact surface is also advantageous, because the contact surface is not attacked by this process step.

The method of the present invention is used to encapsulate inertial sensors using anodically bondable cap wafers without the technically costly backside contacting. In the method described, the anodically bondable cap wafer is structured in a way that allows electrical contacting of the sensor structures as in the sealing-glass encapsulation technology customary till now.

In this context, a method for structuring an anodically bondable composite cap wafer is advantageously described, which permits electrical contacting of the sensor structures located below the cap wafer. The method described allows a significant reduction in the surface of the sensor chip compared to the existing sealing-glass encapsulation techniques, and keeps the technological expenditure small, especially compared to methods which include backside contacting. Therefore, it represents a comparatively cost-effective alternative for encapsulating inertial sensors and other micromechanical sensors by anodic bonding methods. The possible cost advantage compared to a backside contacting lies in the avoidance or the replacement of several costly process steps. It is particularly advantageous that the planarization of the cap can be omitted by replacing it in nearly cost-neutral fashion by thinning the back of the cap. Advantageously, in particular, the method of the present invention eliminates the need for the back grinding and the stress relief of the sensor substrate, Si-DRIE of isolation trenches, the refill technique and the producing of electrical contact surfaces on the backside of the sensor substrate.

A further advantage lies in the compatibility of the process platform necessary in this method with the existing processes and equipment for the series production of micromechanical products, since no technically painstaking backside contacting is necessary in this method.

Furthermore, the method described advantageously permits encapsulation of inertial sensors using thin caps. The limitation of the thickness downward is determined by the minimal thickness of the glass wafer and the mechanical stability of the cap. The first is determined by the breakdown voltage of the glass substrate in response to the anodic bonding. In addition, the possibility also exists to thin down the functional wafer on the backside, and thus to produce thin substrates which are also suitable for so-called "stacked chip" variants.

Advantageously, the present invention may be used for acceleration sensors, yaw-rate sensors and all other micromechanical sensors for which encapsulation with anodically bondable cap wafers is advantageous.

DETAILED DESCRIPTION

Figure 1:
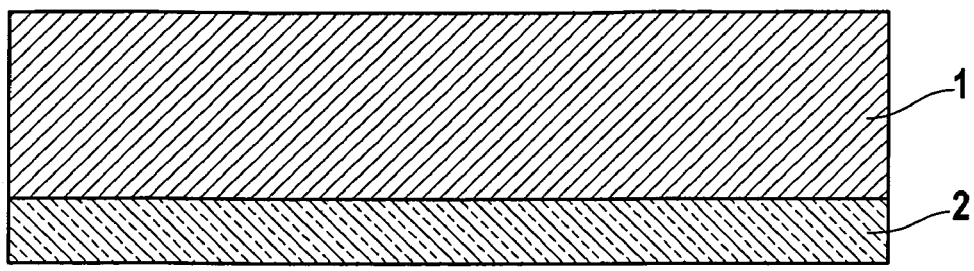
FIG. 1 shows a cap wafer in the form of a composite cap wafer.

FIG. 1 shows a cap wafer in the form of a composite cap wafer made up of a first silicon substrate 1 and a thin glass substrate 2. Thin glass substrate 2 is intended to permit the anodic bondability of the cap wafer.

Figure 2:
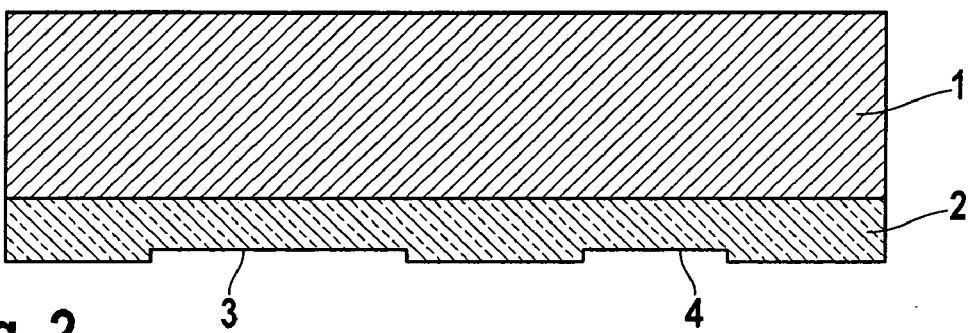
FIG. 2 shows the introduction of recesses into the cap wafer.

FIG. 2 shows a first recess 4 and a further recess 3 which are introduced into thin glass substrate 2 of the cap wafer.

Figure 3:
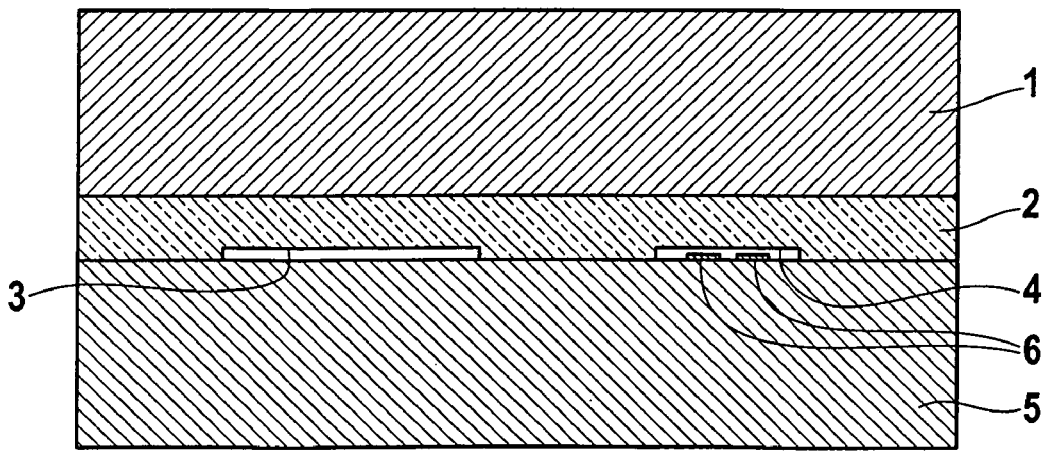
FIG. 3 shows the anodic bonding of the cap wafer to a functional wafer.

FIG. 3 shows the anodic bonding of the composite cap wafer, made up of first silicon substrate 1 and thin glass substrate 2, to a functional wafer. The functional wafer is made up of at least a second silicon substrate 5 and has at least one electrical contact surface 6 as well as, on the same side, a micromechanical structure which is not shown separately. After the bonding, first recess 4 forms a cavity over electrical contact surface 6. Further recess 3 forms a cavity over the micromechanical structure and protects this structure by encapsulation.

Figure 4:
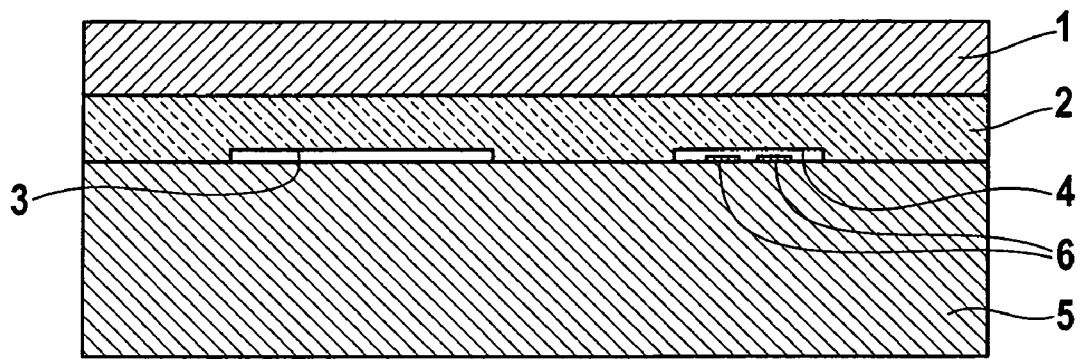
FIG. 4 shows the thinning of the cap wafer on the backside.

FIG. 4 shows the thinning of first silicon substrate 1 of the cap wafer on the back side. This process step is not absolutely necessary, but can lead to reduced process costs in the following process step. The thinning may be accomplished by customary methods such as grinding or wet etching.

Figure 5:
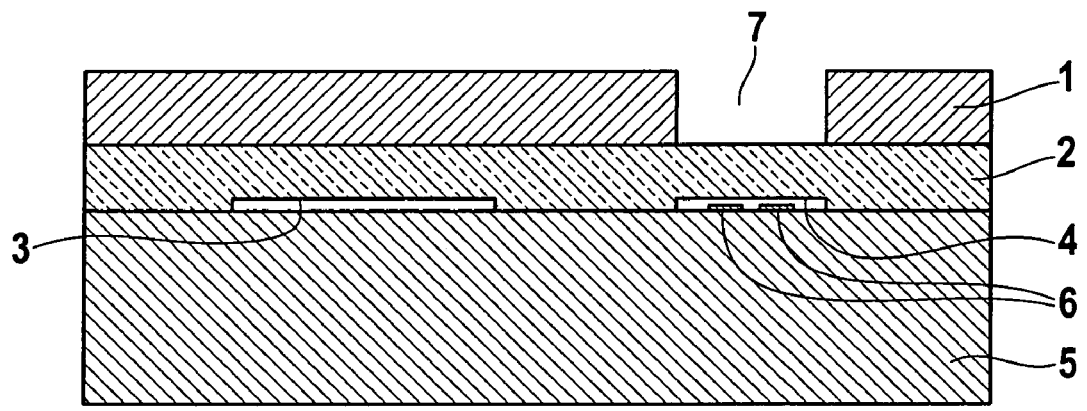
FIG. 5 shows a first sub-step for producing a second recess in the cap wafer.

FIG. 5 shows a first sub-step for producing a second recess in the cap wafer. To that end, at least a first opening 7 is structured into first silicon substrate 1 above first recess 4 by an Si-RIE process. In this connection, the process duration and process costs are a function of the residual thickness of first silicon substrate 1. They can be influenced by the optional process step described under FIG. 4.

Figure 6:
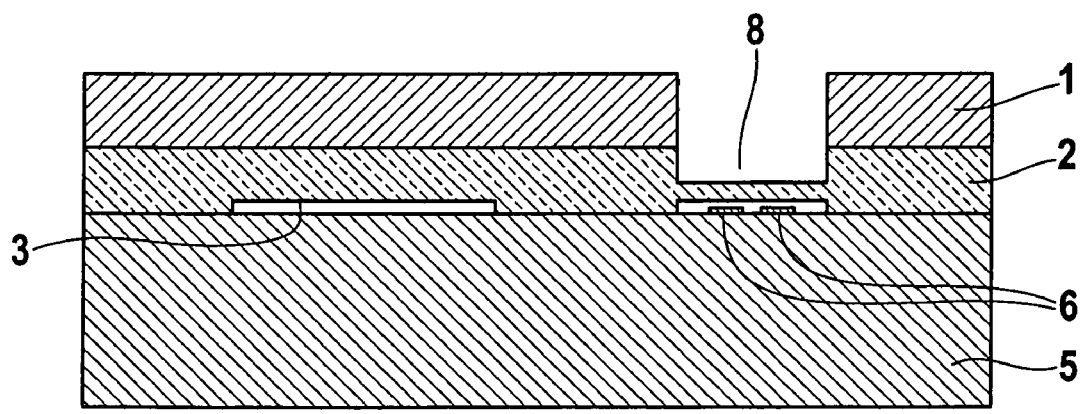
FIG. 6 shows a second sub-step for producing a second recess in the cap wafer.

FIG. 6 shows a second sub-step for producing a second recess in the cap wafer. After producing first opening 7, first silicon substrate 1 represents a mask through which a second opening 8 is structured into glass substrate 2. The function of first silicon substrate 1 as a mask represents an important feature in this process step. This process step is not absolutely necessary, but can lead to a considerable cost reduction in the following process step. The pre-structuring may be performed in the batch process using wet-chemical etching methods, and is therefore cost-effective.

Second opening 8 does not yet extend to first recess 4. Namely, a complete structuring of the glass substrate is not possible without a protection for electrical contact surfaces 6, in this example aluminum bonding pads, since the aluminum surface would be fluorinated in the etch bath.

Figure 7:
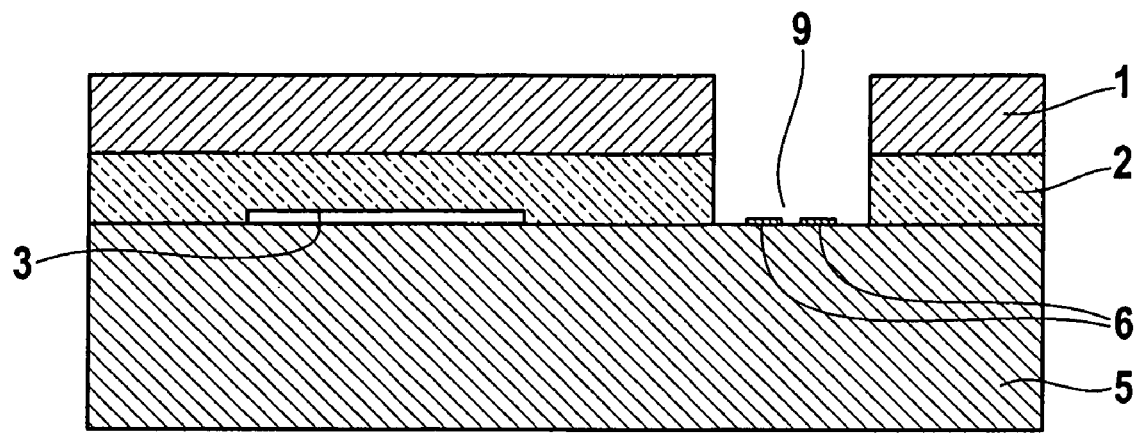
FIG. 7 shows a third sub-step for producing a second recess in the cap wafer, and schematically shows the micromechanical component according to the present invention.

FIG. 7 shows a third sub-step for producing a second recess in the cap wafer, and schematically shows the micromechanical component according to the present invention. To that end, in this example, a third opening 9 is structured into glass substrate 2 using dry-chemical etching methods such as oxide-RIE. An important feature in this process step is again the function of first silicon substrate 1, pre-structured in the first sub-step, as a mask in the structuring of glass substrate 2 with a high selectivity of silicon to glass of approximately 27:1. Ultimately, the third sub-step produces an access 9 through the cap wafer to electrical contact surface 6.

Figure 8:
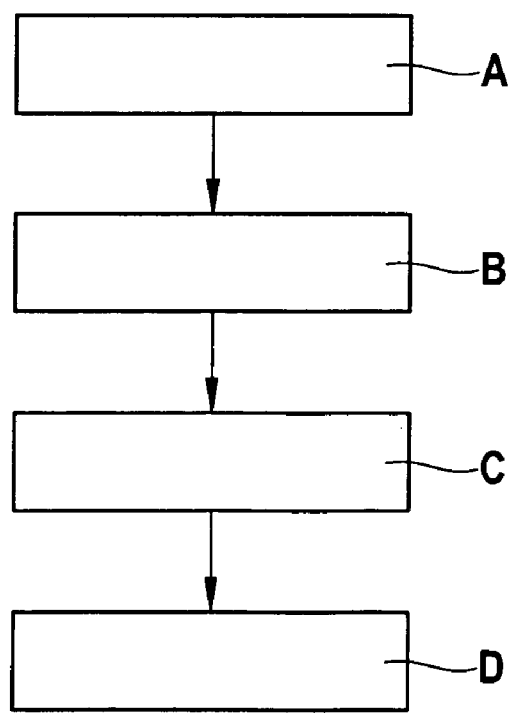
FIG. 8 shows schematically a method of the present invention for manufacturing a micromechanical component having an anodically bonded cap.

FIG. 8 shows schematically a method according to the present invention for manufacturing a micromechanical component having an anodically bonded cap. The method of the present invention includes the following manufacturing steps:

(A) Providing a cap wafer made up of at least a first silicon substrate 1 and a thin glass substrate 2, as well as a functional wafer made up of at least a second silicon substrate 5 having at least one electrical contact surface 6.
(B) Producing at least a first recess 4 in the cap wafer.
(C) Anodically bonding the cap wafer on the side of thin glass substrate 2 to the functional wafer, first recess 4 in the cap wafer being disposed opposite electrical contact surface 6 of the functional wafer.
(D) Producing at least a second recess in the cap wafer, which is advanced up to first recess 4 in such a way that an access 9 is opened to electrical contact surface 6.

In addition, further exemplary embodiments are also conceivable.

What is claimed is:

1. A micromechanical component comprising:
a cap wafer including at least a first silicon substrate and a thin glass substrate;
a functional wafer including at least a second silicon substrate; and
at least one electrical contact surface situated on the functional wafer,
wherein the thin glass substrate of the cap wafer is joined to the functional wafer by anodic bonding,
wherein the electrical contact surface is situated on a side of the functional wafer facing the cap wafer, and
wherein the cap wafer has at least one recess extending vertically through the first silicon substrate and the thin glass substrate to the functional wafer, such that an access is provided to the electrical contact surface.

2. the micromechanical component according to claim 1, wherein the recess is an access opening in the cap wafer in the form of a contact via.

* * * * *